(12) United States Patent
Knoblinger et al.

(10) Patent No.: US 7,482,663 B2
(45) Date of Patent: Jan. 27, 2009

(54) SEMICONDUCTOR CIRCUIT ARRANGEMENT

(75) Inventors: Gerhard Knoblinger, Villach (AT); Klaus Von Arnim, Herzhorn (AT)

(73) Assignee: Infineon Technologies AG, Munich (DE)

( * ) Notice: Subject to any disclaimer, the term of this patent is extended or adjusted under 35 U.S.C. 154(b) by 36 days.

(21) Appl. No.: 11/653,770

(22) Filed: Jan. 16, 2007

(65) Prior Publication Data

US 2007/0181942 A1 Aug. 9, 2007

(30) Foreign Application Priority Data

Jan. 16, 2006 (DE) ............... 10 2006 001 997

(51) Int. Cl.
*H01L 29/76* (2006.01)
(52) U.S. Cl. ............... 257/401; 257/350; 257/352; 257/365; 257/E29.275; 257/E29.137
(58) Field of Classification Search ........... 257/401, 257/E29.275
See application file for complete search history.

(56) References Cited

U.S. PATENT DOCUMENTS

| 3,813,586 A | 5/1974 | Conner |
| 2003/0027385 A1 | 2/2003 | Park et al. |
| 2004/0149991 A1 | 8/2004 | Won |
| 2004/0188725 A1 * | 9/2004 | Fujiwara et al. ............. 257/288 |
| 2004/0224474 A1 | 11/2004 | Barth et al. |
| 2005/0242395 A1 | 11/2005 | Chen et al. |
| 2006/0115940 A1 * | 6/2006 | Kim et al. .................... 438/197 |

FOREIGN PATENT DOCUMENTS

EP 1 471 576 A2 10/2004

* cited by examiner

*Primary Examiner*—Tu-Tu V Ho
(74) *Attorney, Agent, or Firm*—Brinks Hofer Gilson & Lione

(57) ABSTRACT

A semiconductor circuit arrangement includes at least one first and a second field effect transistor, where the field effect respectively have at least two active regions with, respectively, a source region, a drain region and an intermediate channel region, the surface of the channel regions having a gate formed on it, insulated by a gate dielectric, for actuating the channeel regions. At least one active region of the second field effect transistor is arranged between the at least two active regions of the first field effect transistor, which results in a reduced mismatch between the two transistors, caused by temperature and local distances.

29 Claims, 6 Drawing Sheets

SEMICONDUCTOR CIRCUIT ARRANGEMENT

PRIORITY CLAIM

This application claims the benefit of priority of German Patent Application No. 10 2006 001 997.0, filed Jan. 16, 2006, the contents of which are incorporated by reference hereby.

BACKGROUND

1. Technical Field

The present invention relates to a semiconductor circuit arrangement and particularly to an analog circuit having at least two field effect transistors which has a reduced mismatch caused by temperature and location.

2. Background Information

For future sub-45-nanometer complementary metal oxide semiconductor (CMOS) technologies, i.e. for field effect transistors with a gate length of less than 45 nanometers, new types of transistor architectures are currently being developed on the basis of what are known as multigate field effect transistors (MuGFETs). In the text below, multigate FETs are understood to be a broad term for field effect transistors having a multiplicity of gates or control electrodes, which also include transistors such as double-gate FETs, triple-gate FETs or FinFETs. The advantage of these new transistors over what are known as planar bulk MOSFETs, i.e. field effect transistors which are in planar form in the semiconductor substrate, is improved control of the short channel effects through a symmetrical arrangement of a plurality of transistor gates.

The present technologically favored arrangement includes two lateral gates, such as are known from FinFETs, or two lateral gates and an additional gate on the surface of a silicon fin, as are also known as triple-gate FETs. In this context, the silicon fin is also called a rib.

A drawback of such transistor architectures is their inadequate temperature response, however. On account of the three-dimensional topology of the field effect transistors and on account of the fact that the fins or ribs are normally surrounded on all sides by oxide, which is a poor conductor of heat, the power loss arising in the fins or ribs cannot be dissipated as efficiently as in conventional bulk transistors, for example.

Particularly for analog applications, the problem therefore arises that different temperatures in the fins or ribs, which are subsequently referred to as active regions, result in an increased mismatch caused by temperature differences. A need exists, therefore, for a semiconductor circuit arrangement for analog applications which has a reduced temperature-related mismatch.

BRIEF SUMMARY

Particularly the arrangement of at least one active region or a fin of the second field effect transistor between the active regions or fins of the first field effect transistor produces very good temperature equalization between the field effect transistors in the semiconductor circuit arrangement, which allows a temperature-related mismatch to be substantially reduced.

Preferably, the active regions are formed from monocrystalline semiconductor material in the form of a fin or a rib parallel to one another on the surface of an insulator layer or from an silicon-on-insulator (SOI) substrate. This allows sub-45-nanometer field effect transistors with outstanding electrical properties to be produced relatively inexpensively.

Preferably, a metal midgap material is used for the control electrode or the gate, i.e. a material whose work function is situated in the center of the bandgap of the material of the active region or of the semiconductor material used. This allows a further improvement in the electrical properties of the semiconductor circuit arrangement.

In addition, an insulating layer with good thermal coupling can be formed between the active regions or the fins, which allows a further improvement in a heat distribution in the semiconductor circuit arrangement. In addition, the source regions or drain regions of the field effect transistors can be electrically connected to one another, which allows a space saving common source architecture to be implemented, particularly when the source regions are connected.

Preferably, the field effect transistors have the same number of active regions with the same respective dimensions, which allows symmetrical analog circuits with little mismatch to be produced in a very simple manner. However, the field effect transistors may also have a different number of active regions, which allows different channel widths to be set very easily for the respective transistors.

Preferably, a respective reactive region may be arranged next to the outermost active regions of the semiconductor circuit arrangement, said reactive region having the same shape and the same dimensions as an active region. This firstly allows photolithographically caused distortions in the layout to be corrected and, furthermore, also allows an improvement in a mismatch for structures in the edge regions.

In addition, the active regions of the field effect transistors can also be combined into groups and particularly into pairs, with at least one group for the second field effect transistor being arranged between at least two groups for the first field effect transistor. This means that it is also possible to use fabrication methods, such as spacer methods or the use of "alternating face shift" masks, in which two or more respective active regions or fins are formed at the same time.

The field effect transistors used are preferably multigate field effect transistors and, in particular, dual gate FETs, triple gate FETs or FinFETs, which are formed on an SOI substrate and produce analog circuits, such as current mirror circuits.

Preferably, a width of the active region or of the fin or of the rib is much smaller than a length of the gate or of the control electrode, which allows good electrostatic control over the channel zones to be ensured.

BRIEF DESCRIPTION OF THE DRAWINGS

The invention is described in more detail below using exemplary embodiments with reference to the drawing, in which.

DETAILED DESCRIPTION

Figure 1A:
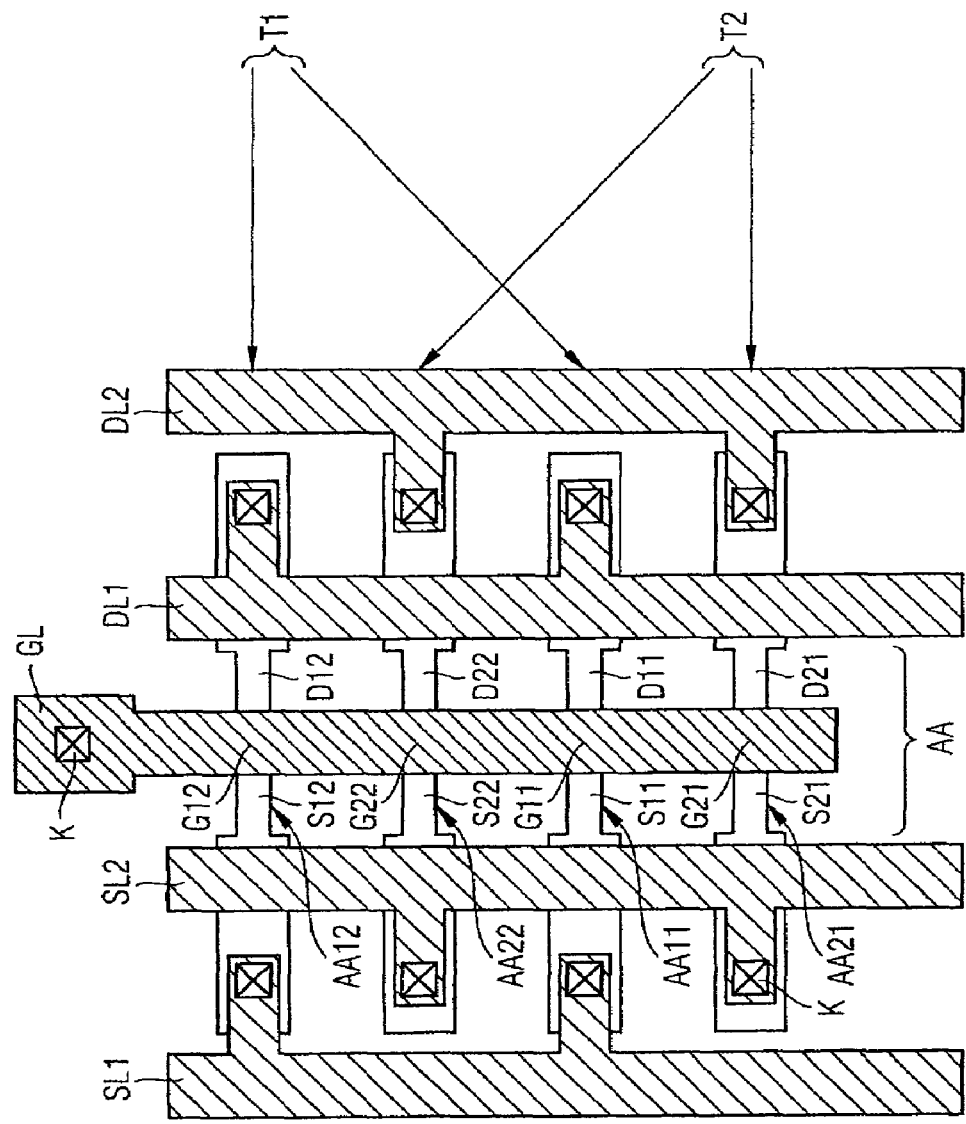
FIGS. 1A to 1C show a simplified plan view, a perspective view and a sectional view of a semiconductor circuit arrangement.
Figure 1B:
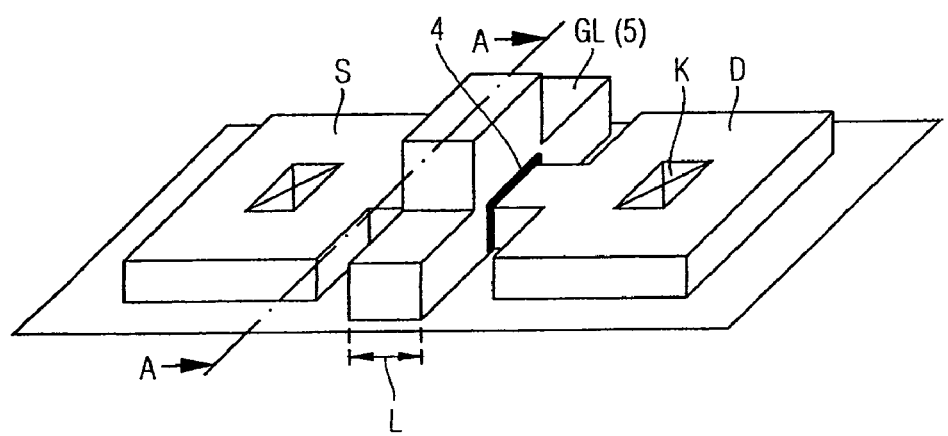
Figure 1C:
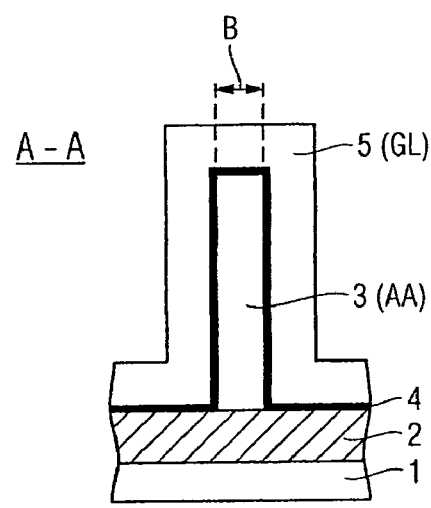

FIGS. 1A to 1C respectively show a simplified plan view of a semiconductor circuit arrangement based on a first exemplary embodiment and an associated perspective partial view and an associated sectional view.

In line with FIG. 1A, the semiconductor circuit arrangement based on the first exemplary embodiment has a first field effect transistor T1 and a second field effect transistor T2, which may respectively have two active regions AA11 and AA12 and also AA21 and AA22.

In line with FIG. 1B, the active regions are in fin form or rib form, for example, and their opposite ends have source and drain connection regions S and D, which are preferably enlarged, in order to allow or to simplify contact connection to a contact K. The active regions AA11 to AA22 accordingly have, respectively, a source region S11 to S22, a drain region D11 to D22 and an intermediate channel region, with the surface of the channel regions having a control electrode or a gate G11 to G22 formed on it, respectively insulated by a gate dielectric 4, for the purpose of actuating the channel region.

In line with FIG. 1C, an active region of this kind, which rises vertically from a surface, is preferably formed from an SOI substrate, with a basic substrate, preferably made of silicon, having an insulator layer 2, preferably made of SiO2, formed on it, the surface of said insulator layer in turn having a thin semiconductor layer 3, that is to say one that is approximately 5 to 10 nm thick or high. In the case of SOI substrates, the semiconductor layer 3 comprises monocrystalline silicon.

The rib-like or fin-like active region is preferably structured using suitable etching methods, as a result of which the shape shown in FIGS. 1A to 1C can be etched out.

As an alternative to the preferably used silicon, it is naturally also possible to use other semiconductor materials, such as what are known as III V composite semiconductors or what is known as strained semiconductor material (e.g. strained silicon). To produce the gate dielectric 4, the whole area, for example, may be blanketed with an insulating layer, such as SiO2, or what are known as high k materials, which results in the insulating layers required for the channel regions. High k dielectrics are understood to mean dielectric materials or insulating layers with a dielectric constant which is higher than the dielectric constant of silicon dioxide with k being approximately 3.9, i.e. k is greater than 4 to 20.

In line with FIG. 1A, the active regions AA11 to AA22 are accordingly formed essentially parallel to one another on the surface of the insulator layer 2, with the fins or ribs respectively having the same shape or the same dimensions. Although, on the basis of the first exemplary embodiment, the fins or ribs are formed with essentially perpendicular lateral faces, it is fundamentally also possible to use active regions with a different shape. In particular, chamfered lateral faces of the fins or ribs are also conceivable in this context, these meeting the surface of the insulator layer 2 at an angle of greater than 90 degrees.

In line with FIG. 1A, the active regions of the two field effect transistors are now arranged such that at least one active region AA22 of the second field effect transistor T2 is situated between the two active regions AA11 and AA12 of the first field effect transistor. This merges the two field effect transistors T1 and T2, which allows very good temperature equalization between the transistors and thus reduces a temperature related mismatch between the two transistors.

To be more precise, the parallel fins or ribs of the, by way of example, two field effect transistors with their multiplicity of active regions or ribs can be arranged alternately next to one another such that almost the same temperatures prevail in both transistors, which allows excellent alignment, particularly when producing analog circuits. In addition to the improved temperature response, what is known as a matching response is also improved as a result of the reduced physical separation of the active elements of the respective transistors. In particular, this allows a significant reduction in, by way of example, parameter fluctuations, which can arise on account of spatially different dopant concentrations. The electrical properties of such a semiconductor circuit arrangement are therefore significantly improved.

To produce the control electrodes or the respective gates G11 to G22, an electrically conductive gate line GL is preferably formed in a strip shape at right angles to the active regions and above the channel regions isolated by the gate dielectric 4, which allows the respective transistor elements of the field effect transistors T1 and T2 to be actuated. In line with FIGS. 1B and 1C, a width B of the active regions AA11 to AA22 here is substantially smaller than a length L of the associated control electrodes or the gates G11 to G22.

To produce the sub-45-nanometer transistors mentioned at the outset, it is accordingly possible to structure the gate line GL to have a width of less than 45 nanometers, which therefore stipulates the length L of the control electrode or the gates. With such a gate length L, a width B of the fins or active regions AA11 to AA22 would preferably be in a range around 30 nanometers. With such a ratio of gate length L to the thickness or width B of the active regions, it is possible to ensure good electrostatic control over the channel zones. A height of the fins or active regions, which are preferably formed perpendicularly on the insulator layer 2, may typically be 60 nanometers in the case mentioned above.

The material used for the control electrode or for the gate line GL is preferably what is known as a midgap material, which preferably uses a work function in the center of the bandgap of the semiconductor material used. When using silicon as the semiconductor material for the active regions or the fins and ribs, it is accordingly possible to use TiN, TaN, TaCN etc., for example. Besides these metal materials for the control electrodes, it is naturally also possible to use highly doped semiconductor materials.

Preferably, what are known as multigate field effect transistors, which have a multiplicity of control electrodes or gates, are used to produce the field effect transistors. In particular, what are known as dual gate FETs, triple gate FETs or FinFETs may be mentioned here as implementation options.

Following formation of the gate line GL shown in FIGS. 1A to 1C on the lateral faces and the top face of the fins or active regions and the surface of the gate dielectric layer 4, one or more insulating layers are finally also formed and preferably deposited as an intermediate dielectric. Finally, for the purpose of actuating the respective active regions, a source line SL1 and a drain line DL1 for the first field effect transistor T1 and a second source line SL2 and a second drain line DL2 for the second field effect transistor T2 can respectively be formed parallel to the gate line GL on the intermediate dielectric. Preferably, these source and drain lines SL1 to DL2 are made of a metal material, particularly copper, with barrier layers for preventing diffusion of the material out into the intermediate dielectric and particularly into the active regions also being able to be provided. By way of example, what are known as single or dual damascene methods may be used in this context.

In addition, the source and drain lines SL1 to DL2 may have projections or lugs which allow simplified contact connection of the underlying connection regions to the active regions by means of contacts K. This results in a very simple layout which allows a semiconductor circuit arrangement with a reduced thermally caused mismatch on a very small face.

Although conventional silicon dioxide with its low thermal conductivities can also be used as an intermediate dielectric or as insulating layer between the active regions AA11 to AA22 in the inventive implementation, a further improvement in the electrical properties and particularly a reduction in the mismatch between the field effect transistors T1 and T2 is also made possible through the use of an insulating layer with good thermal coupling, i.e. high thermal conductivity. Improved thermal coupling can also be achieved through the use of a thinner insulator layer, for example, which isolates the active regions from the underlying semiconductor substrate.

Normally, the distance between two active regions or fins (fin pitch) is shorter than the distance between two contact holes or contacts (contact pitch). In this case, the distance between two active regions must be slightly increased in order to be able to implement the invention in optimum fashion.

On account of the alternate arrangement of the active regions of at least two multigate transistors, it is for the first time possible to produce analog circuits, in particular, with an outstanding matching response.

Figure 2:
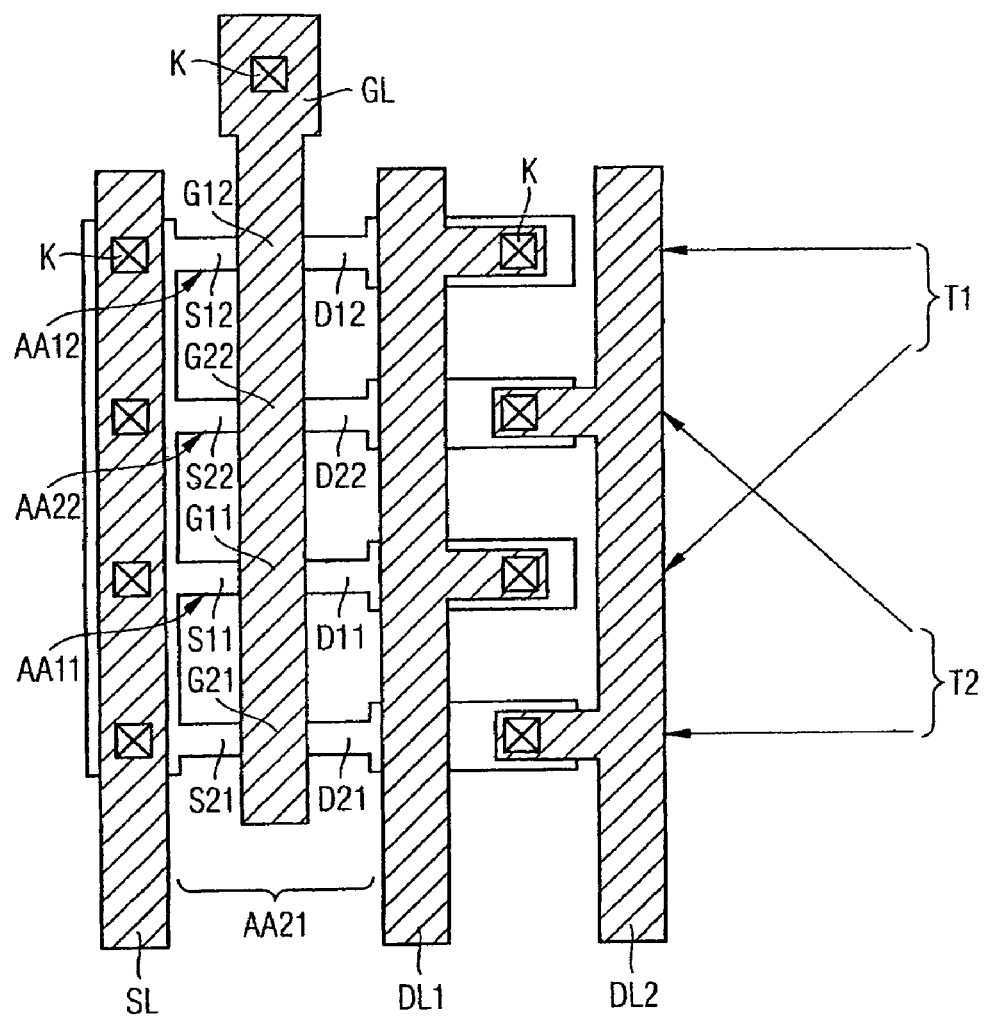
FIG. 2 shows a second example simplified plan view of a semiconductor circuit arrangement.

FIG. 2 shows a simplified plan view of a semiconductor circuit arrangement based on a second exemplary embodiment, with the same reference symbols denoting the same or corresponding elements as in the FIGS. 1A to 1C, for which reason a repeat description is not given below.

In the second exemplary embodiment shown in FIG. 2, a further reduction in a space requirement and a simplification for a circuit may be achieved by virtue of either the source regions S11 to S22 or the drain regions D11 to D22 of the two field effect transistors T1 and T2 being electrically connected to one another or combined. In line with FIG. 2, what is known as a common source architecture is preferably proposed, where the source connection regions S of the source regions S11 to S22 of the two field effect transistors T1 and T2 are expanded such that they touch and make a direct electrical connection, and together with the active regions or the drain connection regions D they produce a comb structure. Although, in principle, simple contact connection for this combined source connection region S would itself be sufficient, a further reduction in the resistances is achieved by using a multiplicity of contacts K to make multiple contact connection from the source line SL to the common source connection region. In line with FIG. 2, it is thus possible to produce a current mirror circuit having two transistors, for example, in very simple and space saving fashion.

Figure 3:
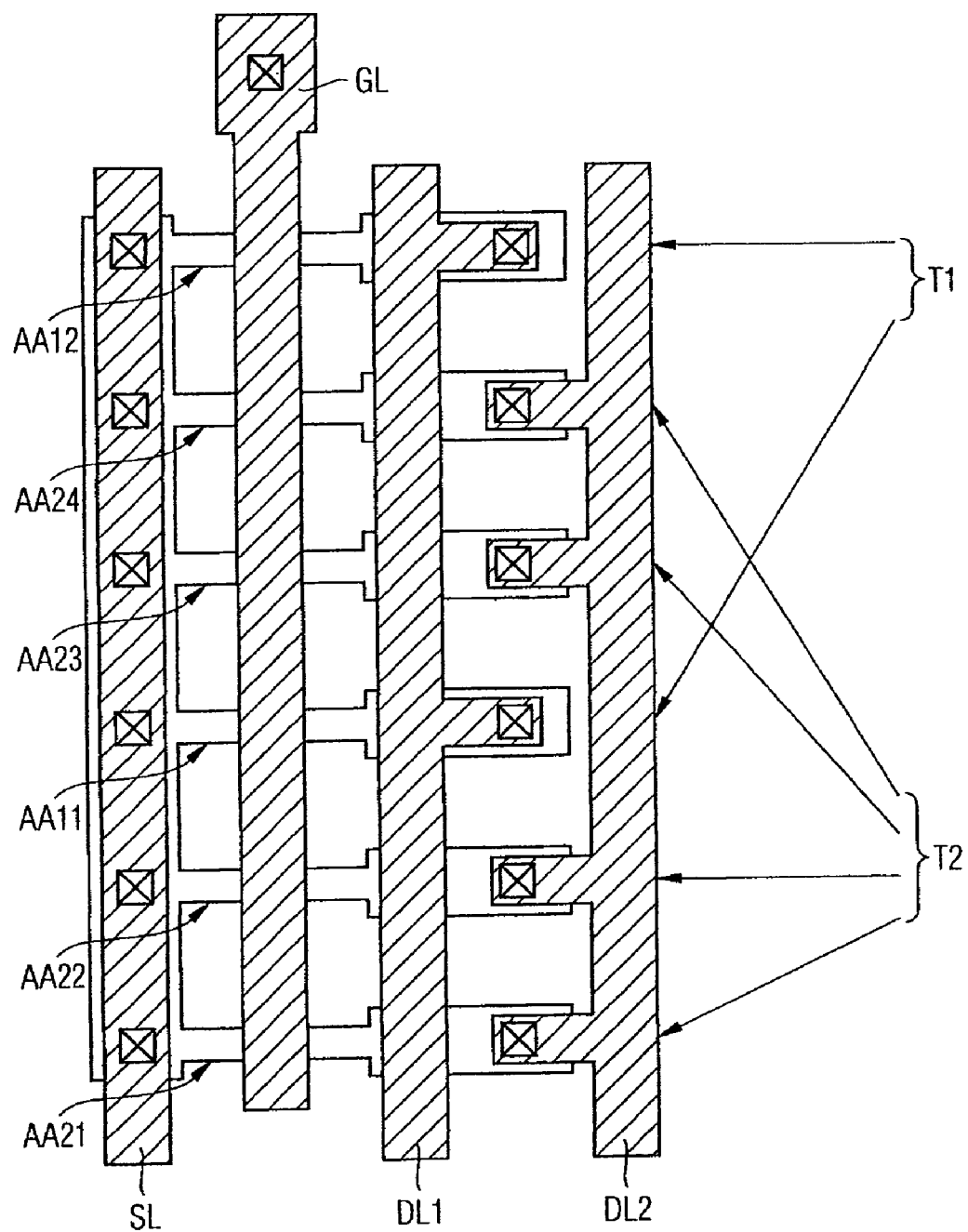
FIG. 3 shows a third example simplified plan view of a semiconductor circuit arrangement.

FIG. 3 shows a simplified plan view of a semiconductor circuit arrangement based on a third exemplary embodiment, where the same reference symbols again denote the same elements or layers as in FIGS. 1 and 2, for which reason a repeat description is not given below.

In line with this third exemplary embodiment, the multiplicity of field effect transistors T1 and T2 may respectively have a different number of active regions or fins or ribs AA11 to AA24. To be more precise, the first transistor T1 in this context may have just two active regions AA11 and AA12, whereas the second field effect transistor T2 may comprise four active regions AA11 to AA24 which respectively have the same shape and dimensions. In this way, a different number of active regions or fins can be used to set a desired channel width ratio for the two transistors relative to one another in very simple and fine grained fashion. In line with FIG. 3, a channel width ratio of W1/W2=½ is shown for the two transistors T1 and T2.

Although the third exemplary embodiment shown in FIG. 3 has again been produced in a common source architecture, in the same way it is also possible to have architectures as shown in FIG. 1A, for example, or where the drain lines are combined.

Figure 4:
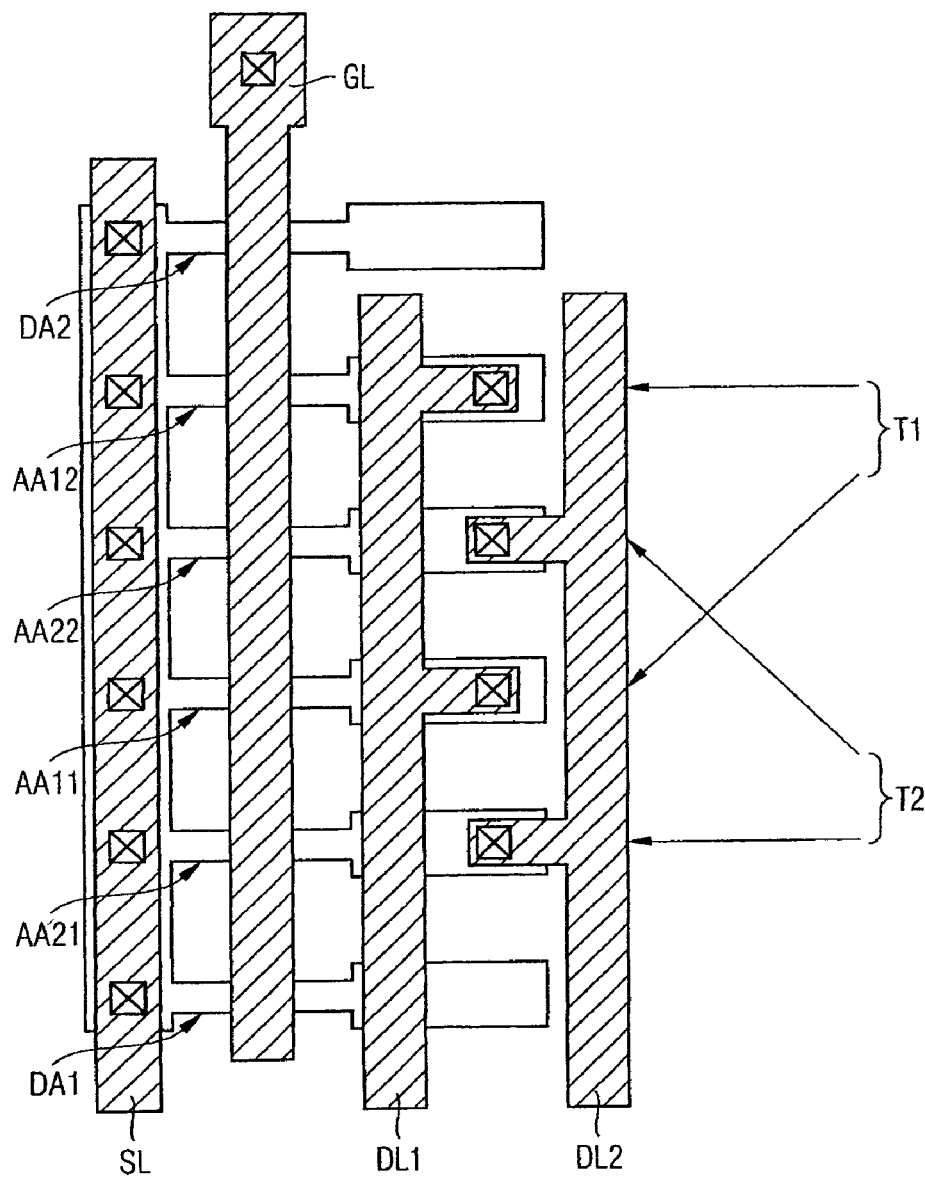
FIG. 4 shows a fourth example simplified plan view of a semiconductor circuit arrangement.

FIG. 4 shows a simplified plan view of a semiconductor circuit arrangement based on a fourth exemplary embodiment, where the same reference symbols denote the same or corresponding elements as in FIGS. 1 to 3, for which reason a repeat description is not given below.

In line with the fourth exemplary embodiment, the use of at least one reactive region or dummy region DA1 or DA2 is now proposed which preferably has the same shape and the same dimensions as the adjacent active region, although it cannot be operated on account of there being no connection.

In line with FIG. 4, a respective reactive region DA1 and DA2 may be arranged next to the outermost active regions AA21 and AA12 of the first and second field effect transistors T2 and T1, for example, with the drain connection regions of the reactive regions DA1 and DA2 having no contact connections. In the same way, a missing contact on the source connection region of the reactive region DA1 and DA2 or on both connection regions could also prevent these reactive elements from operating. On account of these reactive regions DA1 and DA2, it is now not only possible to reduce or even eliminate the distortions on the outermost active regions, which can be observed on account of photolithographic effects, but in addition further homogenization of the temperature distribution can take place over the reactive regions or dummy regions DA1 and DA2.

Although FIG. 4 shows the provision of these reactive regions in connection with the exemplary embodiment shown in FIG. 2, such a combination of reactive regions can also be carried out with the exemplary embodiments shown in FIGS. 1 and/or 3.

Figure 5:
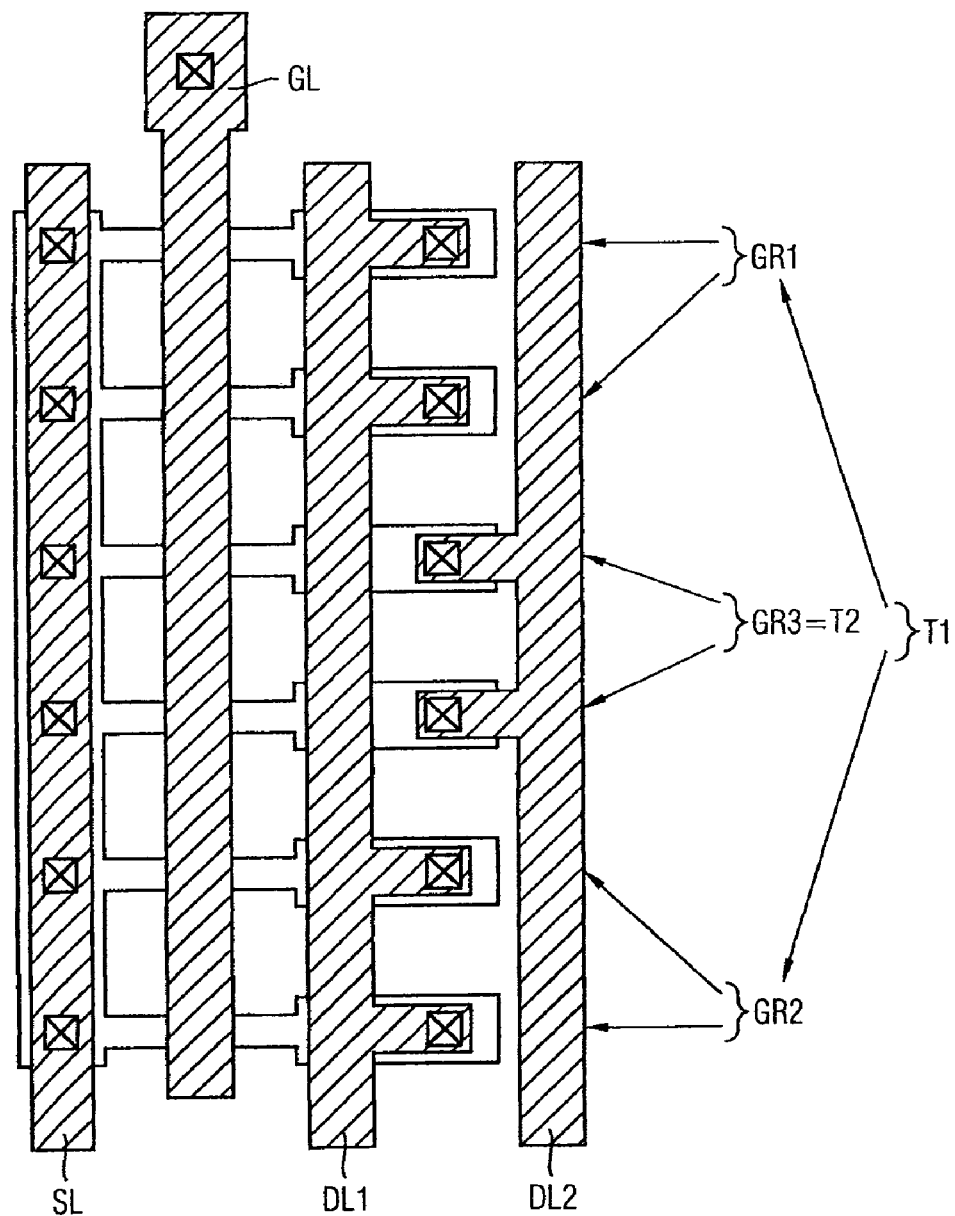
FIG. 5 shows a fifth simplified plan view of a semiconductor circuit arrangement.

FIG. 5 shows a simplified plan view of a semiconductor circuit arrangement based on a fifth exemplary embodiment, where the same reference symbols again denote the same elements or layers as in FIGS. 1 to 4, for which reason a repeat description is not given below.

In line with the fifth exemplary embodiment, the active regions of the field effect transistors T1 and T2 may also have been combined into groups GR1, GR2 and GR3, with at least one group GR3 for the second field effect transistor being arranged between at least two groups GR1 and GR2 for the first field effect transistor T1. In line with FIG. 5, the active regions of the transistors T1 and T2 are combined in pairs, but it is also possible to have other groups, such as groups of three, groups of four and groups of five.

Such an implementation may be appropriate particularly in order to achieve an improved matching response in fabrication methods in which the active regions or fins are, in principle, produced in pairs, for example. This is the case with spacer defined fins or when using what are known as "alternating face shift" masks, for example.

Although FIG. 5 again shows a common source architecture with a common source line SL, it is also possible to make groupings in the architecture shown in FIG. 1A in the same way. In addition, it is also possible to combine this grouping with the reactive regions shown in FIG. 4 and/or the variable channel width setting shown in FIG. 3.

The invention produces a semiconductor circuit arrangement in which the at least two field effect transistors which are to be brought into line with one another are merged into one another or their active regions or fins or ribs are arranged alternately next to one another. In this way, there is not only a resultant closest possible neighborhood for the two field effect transistors and hence very good temperature equalization, but it is also possible to reduce parameter fluctuations on account of spatially different dopant concentrations, for example, to a significant degree, which gives improved electrical properties for the semiconductor circuit.

The invention has been illustrated above using an analog semiconductor circuit arrangement and, in particular, a current mirror circuit having two FinFETs. However, it is not limited thereto and, in the same way, also comprises further analog and digital circuits with alternative multigate field effect transistors.

It is therefore intended that the foregoing detailed description be regarded as illustrative rather than limiting, and that it be understood that it is the following claims, including all equivalents, that are intended to define the spirit and scope of this invention.

The invention claimed is:

1. A semiconductor circuit arrangement comprising:
   at least one first and a second field effect transistor, wherein the field effect transistors respectively include at least two active regions with, respectively, a source region, a drain region and an intermediate channel region, the surface of the channel regions including a gate formed on it, said gate having respective gate regions formed over each of the at least two active regions, each respective gate region insulated by a gate dielectric, for actuating the channel region, and wherein at least one active region of the second field effect transistor is arranged between the at least two active regions of the first field effect transistor; and
   at least one reactive region, which comprises the same shape and the same dimensions as one of the at least two active regions.

2. The semiconductor circuit arrangement of claim 1, wherein the active region comprises a monocrystalline semiconductor material in the form of a fin or a rib.

3. The semiconductor circuit arrangement of claim 2, wherein the fin or the rib is formed parallel to one another on a surface of an insulating layer.

4. The semiconductor circuit arrangement of claim 1, wherein the gate comprises a metal material with a work function in a center of a bandgap of the material of the active region.

5. The semiconductor circuit arrangement of claim 1, further comprising an insulating layer with thermal coupling properties formed between the active regions.

6. The semiconductor circuit arrangement of claim 1, wherein the source regions or drain regions of the at least two field transistors are electrically connected to one another.

7. The semiconductor circuit arrangement of claim 1, wherein the active regions of the at least two field effect transistors have the same dimensions.

8. The semiconductor circuit arrangement of claim 7, wherein the at least two field effect transistors comprise a different number of active regions.

9. The semiconductor circuit arrangement of claim 1, further comprising two reactive regions arranged next to the outermost active regions.

10. The semiconductor circuit arrangement of claim 1, wherein the active regions of the at least first and second field effect transistors are combined into groups, with at least one group for the second field effect transistor arranged between at least two groups for the first field effect transistor.

11. The semiconductor circuit arrangement of claim 1, wherein the field effect transistors comprise multi-region field effect transistors.

12. The semiconductor circuit arrangement of claim 11, wherein the field effect transistors comprise dual region gate field effect transistors (FETs), triple gate FETs or FinFETs.

13. The semiconductor circuit arrangement of claim 1, wherein the semiconductor circuit arrangement is formed in a silicon-on-insulator substrate.

14. The semiconductor circuit arrangement of claim 1, wherein a width of the active region comprises a width much smaller than a length of the gate.

15. The semiconductor circuit arrangement of claim 1, wherein the semiconductor circuit arrangement is designed as an analog circuit.

16. An current mirror comprising the semiconductor circuit arrangement of claim 1.

17. A current mirror circuit comprising:
   at least one first and a second field effect transistor, wherein the field effect transistors respectively include at least two active regions with, respectively, a source region, a drain region and an intermediate channel region, the surface of the channel regions including a gate formed on it, said gate having respective gate regions formed over each of the at least two active regions, each respective gate region insulated by a gate dielectric, for actuating the channel region, and wherein at least one active region of the second field effect transistor is arranged between the at least two active regions of the first field effect transistor; and
   at least one reactive region, which comprises the same shape and the same dimensions as one of the at least two active regions.

18. The semiconductor circuit arrangement of claim 17, wherein the active region comprises a monocrystalline semiconductor material in the form of a fin or a rib.

19. The semiconductor circuit arrangement of claim 18, wherein the fin or the rib is formed parallel to one another on a surface of an insulating layer.

20. The semiconductor circuit arrangement of claim 17, wherein the gate comprises a metal material with a work function in a center of a bandgap of the material of the active region.

21. The semiconductor circuit arrangement of claim 17, further comprising an insulating layer with thermal coupling properties formed between the active regions.

22. A method for producing a semiconductor circuit arrangement, the method comprising:
   forming at least one first and a second field effect transistor, wherein the field effect transistors respectively include at least two active regions with, respectively, a source region, a drain region and an intermediate channel region;
   forming a gate on a surface of the channel regions, said gate having respective gate regions formed over each of the at least two active regions, each respective gate region insulated by a gate dielectric, for actuating the channel region;
   arranging at least one active region of the second field effect transistor between the at least two active regions of the first field effect transistor; and
   forming at least one reactive region, which comprises the same shape and the same dimensions as one of the at least two active regions.

23. The method of claim 22, further comprising forming a monocrystalline semiconductor material as a fin or a rib within the active region.

24. The method of claim 23, wherein forming the fin or the rib of the monocrystalline semiconductor material comprises forming the fin or rib in parallel to one another on a surface of an insulating layer.

25. The method of claim 22, wherein the gate comprises a metal material with a work function in a center of a bandgap of the material of the active region.

26. The method of claim 22, further comprising forming an insulating layer with thermal coupling properties between the active regions.

27. The method of claim 22, further comprising electrically connecting the source regions or drain regions of the at least two field effect transistors to one another.

28. The current mirror of claim 17 further comprising two reactive regions arranged next to the outermost active regions.

29. The method of claim 22 further comprising forming two reactive regions arranged next to the outermost active regions.

* * * * *

UNITED STATES PATENT AND TRADEMARK OFFICE
CERTIFICATE OF CORRECTION

PATENT NO. : 7,482,663 B2  Page 1 of 1
APPLICATION NO. : 11/653770
DATED : January 27, 2009
INVENTOR(S) : Gerhard Knoblinger et al.

It is certified that error appears in the above-identified patent and that said Letters Patent is hereby corrected as shown below:

On the Title Page

Item (75), after "Herzhorn" delete "(AT)" and substitute --(DE)-- in its place.

Item (57), line 7, under "ABSTRACT", before "regions. At least one" delete "channeel" and substitute --channel-- in its place.

In the Claims

Column 7, claim 11, line 60, after "comprise multi-region" insert --gate--.

Column 8, claim 16, line 7, before "current mirror" delete "An" and substitute --A-- in its place.

Column 10, claim 28, line 1, immediately after "claim 17" insert --,--.

Column 10, claim 29, line 3, immediately after "claim 22" insert --,--.

Signed and Sealed this

Twenty-first Day of July, 2009

JOHN DOLL
*Acting Director of the United States Patent and Trademark Office*